United States Patent
Wang

(10) Patent No.: US 9,891,264 B2
(45) Date of Patent: Feb. 13, 2018

(54) LINE DETECTING APPARATUS AND METHOD FOR ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventor: Honghui Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 294 days.

(21) Appl. No.: 14/359,222

(22) PCT Filed: Nov. 1, 2013

(86) PCT No.: PCT/CN2013/086455
§ 371 (c)(1),
(2) Date: May 19, 2014

(87) PCT Pub. No.: WO2014/201794
PCT Pub. Date: Dec. 24, 2014

(65) Prior Publication Data
US 2014/0375347 A1 Dec. 25, 2014

(30) Foreign Application Priority Data
Jun. 20, 2013 (CN) .......................... 2013 1 0247381

(51) Int. Cl.
*G01R 31/26* (2014.01)
*G09G 3/00* (2006.01)

(52) U.S. Cl.
CPC ......... *G01R 31/2607* (2013.01); *G09G 3/006* (2013.01)

(58) Field of Classification Search
USPC .. 324/760.02, 750.3, 760.01, 686, 691, 713, 324/762.03, 76.11, 116, 115, 121 R;
(Continued)

(56) References Cited

U.S. PATENT DOCUMENTS

| | | | | |
|---|---|---|---|---|
| 5,285,150 A | * | 2/1994 | Henley | ................ G01R 31/308 324/73.1 |
| 6,028,442 A | * | 2/2000 | Lee | ........................ G09G 3/006 324/537 |

(Continued)

FOREIGN PATENT DOCUMENTS

| | | |
|---|---|---|
| CN | 102129003 A | 7/2011 |
| CN | 102213739 A | 10/2011 |

(Continued)

OTHER PUBLICATIONS

China Patent Certificate dated Nov. 25, 2015; CN103308817B.
(Continued)

*Primary Examiner* — Melissa Koval
*Assistant Examiner* — Nasima Monsur
(74) *Attorney, Agent, or Firm* — Ladas & Parry LLP; Loren K. Thompson

(57) ABSTRACT

A line detecting apparatus and a line detecting method for an array substrate relates to the field of line detecting technology. The detecting method comprises: arranging an input terminal sensor (30) at a signal input terminal of a wire to be detected, arranging one output terminal sensor (41, 42, 43) at a signal output terminal of the wire to be detected, and arranging other output terminal sensor (41, 42, 43) at a signal output terminal of another wire adjacent to the wire to be detected; measuring an output voltage of the wire to be detected by a voltage detector; and determining the line conduction condition of the wire to be detected according to the output voltage as measured. When the sensors perform
(Continued)

line scan, the coordinate of the specific location where the short-circuit or open-circuit occurs can be found directly without performing scan by PDS or AOI, thus simplifying the technical processes, shortening the time for detecting, and saving the production cost.

16 Claims, 3 Drawing Sheets

(58) Field of Classification Search
USPC ............ 345/174, 173, 104, 211, 87; 236/51; 374/E7.018
See application file for complete search history.

(56) References Cited

U.S. PATENT DOCUMENTS

| | | | | |
|---|---|---|---|---|
| 2002/0180455 | A1* | 12/2002 | Okano | G01R 31/312 324/530 |
| 2005/0206404 | A1 | 9/2005 | Itagaki | |
| 2008/0018338 | A1* | 1/2008 | Eun | G01R 31/024 324/509 |
| 2008/0018339 | A1* | 1/2008 | Eun | G01R 31/2812 324/509 |
| 2010/0182273 | A1* | 7/2010 | Noguchi | G02F 1/13338 345/174 |
| 2010/0225770 | A1* | 9/2010 | Morimoto | G09G 3/006 348/189 |

FOREIGN PATENT DOCUMENTS

| | | |
|---|---|---|
| CN | 102788924 A | 11/2012 |
| CN | 102955097 A | 3/2013 |
| CN | 103091918 A | 5/2013 |
| CN | 103308817 A | 9/2013 |
| JP | 1175275 C | 11/2004 |

OTHER PUBLICATIONS

International Preliminary Report on Patentability dated Dec. 12, 2015; PCT/CN2013/086455.
First Office Action issued by the State Intellectual Property Office ("SIPO") dated Dec. 16, 2014 for International Application No. 201310247381.9, 9 pages.
English translation of first Office Action issued by SIPO dated Dec. 16, 2014 for International Application No. 201310247381.9, 11 pages.
English abstract of CN103091918A, listed above, 1 page.
English abstract of JP1175275C, listed above, 1 page.
International Search Report for International Application No. PCT/CN2013/086455 dated Mar. 5, 2014, 17pgs.

* cited by examiner

LINE DETECTING APPARATUS AND METHOD FOR ARRAY SUBSTRATE

CROSS REFERENCE TO RELATED APPLICATIONS

This application is based on International Application No. PCT/CN2013/086455 filed on Nov. 1, 2013, which claims priority to Chinese National Application No. 201310247381.9 filed on Jun. 20, 2013. The entire contents of each and every foregoing application are incorporated herein by reference.

TECHNICAL FIELD

The present disclosure relates to a field of line detecting technique, and more particularly to a line detecting apparatus and method for an array substrate.

BACKGROUND

An array substrate of a Thin Film Transistor Liquid Crystal Display (referred to as a TFT-LCD in brief) is manufactured through complicate technical flows, and the phenomena such as an open-circuit or a short-circuit are prone to occur on the lines of the substrate, and the yield rate of products can be increased by detecting and repairing the lines on the substrate where the open-circuit or the short-circuit occurs; thus the purpose of improving the detecting efficiency and saving the cost can be achieved by expediting the detecting speed of the detecting apparatus and simplifying the hardware structure of the detecting apparatus.

There are a number of parallel wires on the array substrate of the TFT-LCD, wherein the parallel wires comprise gate lines and data lines in general; when an open-circuit or a short-circuit appears in such parallel wires due to particles or metal residual and the like, the detecting approach in the prior art firstly needs to perform line scanning by a Line Detecting Sensor (LDS) to find the location where a defective line is located as a whole. As shown in FIG. 1, taking a gate line 1 as an example, a voltage input terminal 2 and an input terminal sensor 3 connected to the voltage input terminal 2 are arranged at a signal input terminal of the gate line 1, and an output terminal sensor 4, to which an equivalent resistor 5 is connected, is arranged at a signal output terminal of the gate line 1. FIG. 2 is an equivalent circuit diagram of the LDS detecting apparatus, wherein the arrow direction in the FIG. 2 represents the signal transfer direction, $V_{in}$ represents an input voltage, $V_{out}$ represents an output voltage, $C_{10}$ represents a capacitance of the input terminal sensor, $C_{20}$ represents a capacitance of the output terminal sensor, $R_{10}$ represents an equivalent resistance of the wire to be detected, $R_{20}$ represents a resistance of the equivalent resistor 5. Subsequent to the LDS detecting, it needs to perform scan on the defective wire by a Position Detecting Sensor (PDS for short) or by an Auto Optical Inspection (AOI for short) to find the coordinate of the specific location where the failure occurs on the defective wire. The above detecting approach in the prior art has disadvantages such as more technical processes, slower detecting speed, and higher cost.

SUMMARY

(1) The Technical Problem to be Solved

The technical problem to be solved by the embodiments of the present disclosure is how to reduce the technical processes for line detection on the array substrate, thus saving the cost.

(2) Technical Solutions

To solve the above technical problem, in embodiments of the present disclosure, there is provided a line detecting apparatus for an array substrate, comprising: a voltage input terminal; an input terminal sensor connected to the voltage input terminal; an equivalent resistor; a voltage detector connected to the equivalent resistor in parallel; at least two output terminal sensors connected to the equivalent resistor.

Further, a wire to be detected is a gate line, and the at least two output terminal sensors comprise a first output terminal sensor, a second output terminal sensor and a third output terminal sensor, wherein the first output terminal sensor is arranged at a signal output terminal of the gate line, the second output terminal sensor and the third output terminal sensor are arranged respectively at signal output terminals of two common electrodes adjacent to the gate line.

Further, a wire to be detected is a data line, and the at least two output terminal sensors comprise a first output terminal sensor and a second output terminal sensor, wherein the first output terminal sensor is arranged at a signal output terminal of the data line, and the second output terminal sensor is arranged at a signal output terminal of another data line adjacent to the data line.

In the embodiments of the present disclosure, there is further provided a detecting method based on the above described line detecting apparatus for array substrate, comprising: arranging the input terminal sensor at the signal input terminal of the wire to be detected, arranging the first output terminal sensor of the at least two output terminal sensors at the signal output terminal of the wire to be detected, and arranging other output terminal sensor at a signal output terminal of another wire adjacent to the wire to be detected; measuring the output voltage of the wire to be detected by the voltage detector; and determining the line conduction condition of the wire to be detected by comparing the voltage as measured to a normal output voltage.

Further, the wire to be detected is a gate line, and the at least two output terminal sensors comprise a first output terminal sensor, a second output terminal sensor and a third output terminal sensor, wherein the first output terminal sensor is arranged at a signal output terminal of the gate line, the second output terminal sensor and the third output terminal sensor are arranged respectively at signal output terminals of two common electrodes adjacent to the gate line.

Further, the wire to be detected is a data line, and the at least two output terminal sensors comprise a first output terminal sensor and a second output terminal sensor, wherein the first output terminal sensor is arranged at a signal output terminal of the data line, and the second output terminal sensor is arranged at a signal output terminal of another data line adjacent to the data line.

Further, when the wire to be detected has a signal to output but the signal is inconsistent with a normal value, it is determined that a short-circuit occurs on the wire to be detected, and the distance between the position where the short-circuit occurs and a zero point of coordinate is calculated according to the output voltage value of the wire to be detected measured by the voltage detector.

Further, when the wire to be detected has no signal to output, it is determined that an open-circuit occurs on the wire to be detected, and the input terminal sensor is moved in the direction toward the output terminal of the wire to be detected until the output terminal sensor detects a signal.

Further, when the input terminal sensor is moved a position where the output terminal sensor detects a signal, the distance from the position where the open-circuit occurs to the zero point of coordinate is calculated according to the output voltage value of the wire to be detected measured by the voltage detector.

Further, after completing the determination of the line conduction condition of the wire to be detected according to the output voltage of the wire to be detected as measured, the detecting method comprises: moving positions of all the output terminal sensors by one detecting unit in a direction perpendicular to the longitudinal direction of the wire to be detected so as to detect the line conduction condition of a next detecting unit.

(3) Beneficial Effect

In the line detecting apparatus and method for array substrate provided in the above technical solutions, when the sensors perform line scan, the coordinate of the specific location where the short-circuit or open-circuit occurs can be found directly without performing scan by PDS or AOI, thus reducing the technical processes, shortening the time for detecting, and saving the production cost.

DETAILED DESCRIPTION OF THE PREFERRED EMBODIMENTS

Detailed descriptions will be given to the implementations of the present disclosure in connection with the accompanying drawings and embodiments. Obviously, the embodiments as described are only for illustrating the present disclosure, but not intended to limit the scope of the present disclosure.

First Embodiment

Figure 1:
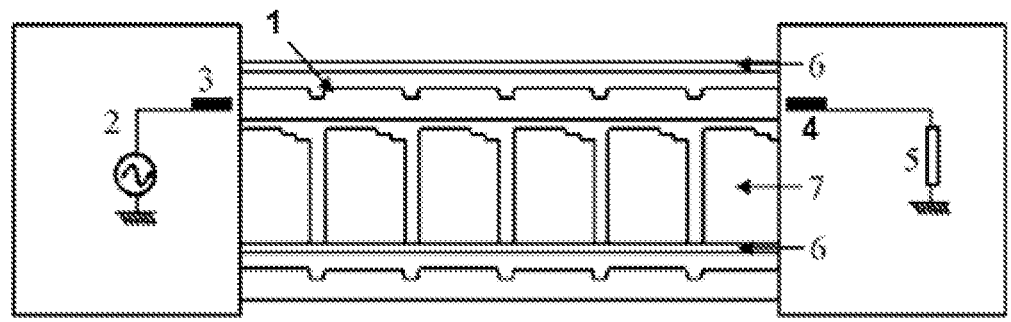
FIG. 1 is a schematic diagram of an existing LDS detecting apparatus.
Figure 2:
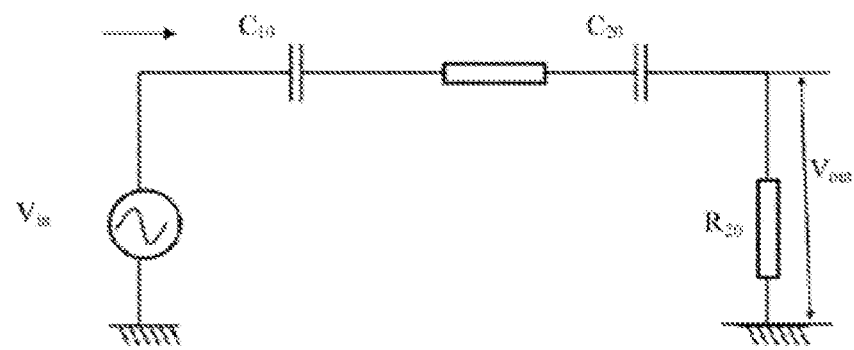
FIG. 2 is an equivalent circuit diagram of an existing LDS detecting mode.
Figure 3:
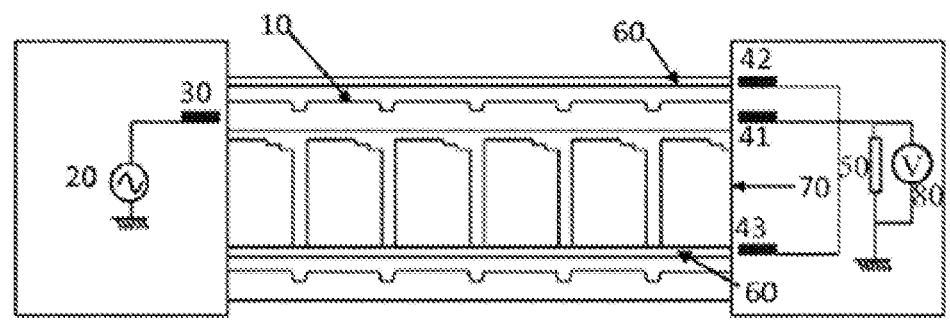
FIG. 3 is a schematic diagram of a line detecting apparatus according to an embodiment of the present disclosure in a normal state.

As shown in FIG. 3, a line detecting apparatus for an array substrate according to an embodiment of the disclosure comprises a voltage input terminal 20; an input terminal sensor 30 connected to the voltage input terminal 20; an equivalent resistor 50 which can be an equivalent resistor of the wire in the line detecting apparatus connected to the output terminal sensor, or a resistor connected in series separately; a voltage detector 80 connected to the equivalent resistor 50 in parallel, for measuring an output voltage of the wire to be detected; at least two output terminal sensors connected to the equivalent resistor 50. Herein, the input terminal sensor 30 and the output terminal sensors are both line detecting sensors.

In the present embodiment, the wire to be detected is a gate line 10, and the at least two output terminal sensors comprise a first output terminal sensor 41, a second output terminal sensor 42 and a third output terminal sensor 43, wherein the first output terminal sensor 41 is arranged at a signal output terminal of the gate line 10, the second output terminal sensor 42 and the third output terminal sensor 43 are arranged respectively at the signal output terminals of two common electrodes 60 adjacent to the gate line 10, and one of the two common electrodes adjacent to the gate line 10 is located on one side of the gate line 10 (as shown in FIG. 3, the upper side of the gate line 10), and the other of the two common electrodes adjacent to the gate line 10 is located on the other side of the gate line 10 (as shown in FIG. 3, the lower side of the gate line 10), and specifically located on one side of the pixel area on the other side of the gate line 10 (as shown in FIG. 3, the lower side of the pixel area on the lower side of the gate line 10).

In the present embodiment, the gate line 10 and the adjacent common electrodes located on both sides of the gate line 10 are taken as one detecting unit, and the line detecting job for one detecting unit is performed at a time; when the line detecting job for one detecting unit is completed, the line detecting job for a next detecting unit is performed after moving the detecting position by integral multiple detecting units; thus, the detecting position can be moved row by row, achieving the line detecting on each gate line.

Figure 4:
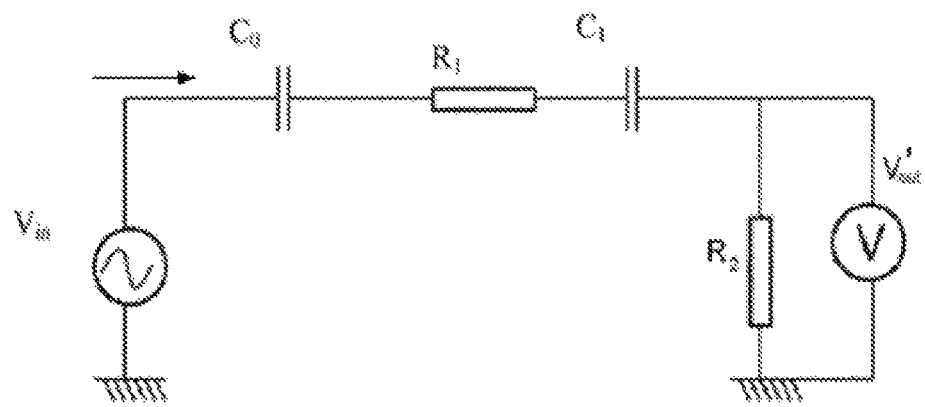
FIG. 4 is an equivalent circuit diagram of the line detecting apparatus according to the embodiment of the present disclosure in the normal state.

During the detecting procedure, the input terminal sensor 30 is arranged at the signal input terminal of the gate line, and a voltage is input to the voltage input terminal 20; wherein the input terminal sensor 30 detects the input voltage signal, and the voltage signal is transmitted via the gate line, and when the first output terminal sensor 41 detects a normal output voltage signal, it shows that the conduction condition of the gate line is in normal, and no phenomena such as short-circuit or open-circuit occurs; as shown in FIG. 3 and FIG. 4, none of the second output terminal sensor 42 and the third output terminal sensor 43 has signal.

Figure 5:
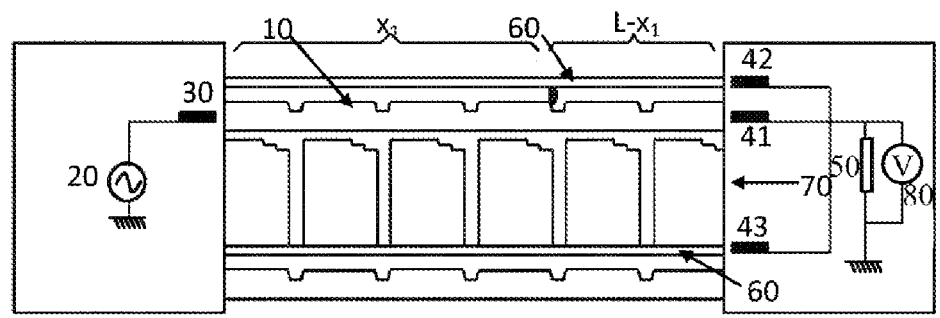
FIG. 5 is a schematic diagram of the line detecting apparatus according to the embodiment of the present disclosure in a short-circuit.
Figure 6:
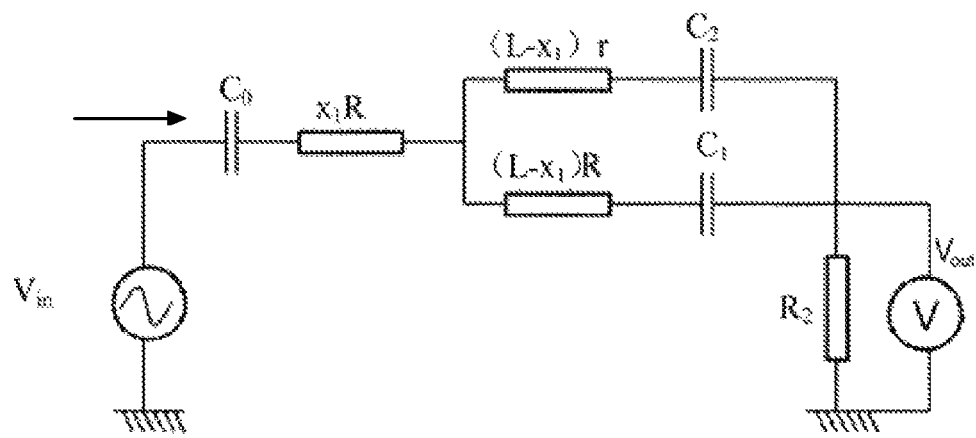
FIG. 6 is a schematic diagram of the line detecting apparatus according to the embodiment of the present disclosure in the short-circuit.

When the output voltage signal detected by the first output terminal sensor 41 is inconsistent with the normal output voltage, it shows that phenomenon of a short-circuit occurs on the gate line as detected; at this time, if the second output terminal sensor 42 has a signal to be transmitted, it shows that a short-circuit occurs between the common electrode 60 to which the second output terminal sensor 42 corresponds and the gate line, as shown in FIG. 5 and FIG. 6; if the third output terminal sensor 43 has a signal to be transmitted, it shows that a short-circuit occurs between the common electrode 60 to which the third output terminal sensor 43 corresponds and the gate line; if the second output terminal sensor 42 and the third output terminal sensor 43 both have signals to be transmitted, it shows that a short-circuit occurs between each of two common electrodes and the gate line.

When the first output terminal sensor 41 receives no signal, it shows that an open-circuit occurs on the gate line 10.

Second Embodiment

The line detecting apparatus for array substrate of the present embodiment differs that of the first embodiment only in that: the wire to be detected is a data line and the at least two output terminal sensors comprise a first output terminal sensor and a second output terminal sensor, wherein the first output terminal sensor is arranged at a signal output terminal of the data line, and the second output terminal sensor is arranged at a signal output terminal of another data line adjacent to the data line.

In the present embodiment, every two adjacent data lines are grouped together and serve as one detecting unit, and a line detecting job for one detecting unit is performed at a time; when the line detecting job for one detecting unit is completed, a line detecting for a next detecting unit is performed after moving the detecting position by integral multiple detecting units, and it can be realized that detecting position is moved by every two data lines; and thus line detecting on each data line is achieved. The two output terminal sensors in each detecting unit are set as the first output terminal sensor and the second output terminal sensor respectively.

During the detecting procedure, the input terminal sensor is arranged at the signal input terminal of one data line, and a voltage is input to the voltage input terminal; wherein the input terminal sensor detects the input voltage signal and the voltage signal is transmitted via the data line, and the first output terminal sensor and the input terminal sensor are connected to a same data line, when the first output terminal sensor detects a normal output voltage signal, it shows that the data line to be detected conducts normally, and there is no short-circuit or open-circuit phenomenon; at this time, the second output terminal sensor has no signal; and when the output voltage signal detected by the first output terminal sensor is inconsistent with the normal output voltage, it shows that phenomenon of a short-circuit occurs on the data line as detected; at this time, if the second output terminal sensor has a signal to be transmitted, it shows that a short-circuit occurs between the data line to be detected and a data line to which the second output terminal sensor corresponds; when the first output terminal sensor receives no a signal, it shows that an open-circuit occurs on a data line to which the first output terminal sensor corresponds.

Third Embodiment

A detecting method of the present embodiment is based on the above described line detecting apparatus for an array substrate in the first embodiment, comprising:

S1, arranging the input terminal sensor at the signal input terminal of the wire to be detected, arranging the first output terminal sensor of the at least two output terminal sensors at the signal output terminal of the wire to be detected, and arranging other output terminal sensor at a signal output terminal of another wire adjacent to the wire to be detected;

S2, measuring the output voltage of the wire to be detected by the voltage detector;

S3, determining the line conduction condition of the wire to be detected according to the voltage as measured;

S4, moving positions of all the output terminal sensors by one detecting unit in a direction perpendicular to the longitudinal direction of the wire to be detected so as to detect the line conduction condition of a next detecting unit.

As shown in FIG. 3, in the present embodiment, the wire to be detected is the gate line 10, and the at least two output terminal sensors comprise a first output terminal sensor 41, a second output terminal sensor 42 and a third output terminal sensor 43, wherein the first output terminal sensor 41 is arranged at a signal output terminal of the gate line 10, the second output terminal sensor 42 and the third output terminal sensor 43 are arranged respectively at the signal output terminals of the two common electrodes 60 adjacent to the gate line 10, and one of the two common electrodes adjacent to the gate line 10 is located on one side of the gate line 10, and the other of the two common electrodes adjacent to the gate line 10 is located on one side of the pixel area on the other side of the gate line 10.

In the present embodiment, the gate line 10 and the adjacent common electrodes located on both sides of the gate line 10 are taken as one detecting unit, and the line detecting job for one detecting unit is performed at a time; when the line detecting job for one detecting unit is completed, the line detecting job for a next detecting unit is performed after moving the detecting position by integral multiple detecting units.

During the detecting procedure, the input terminal sensor is arranged at the signal input terminal of the gate line, and a voltage is input to the voltage input terminal; wherein the input terminal sensor detects the input voltage signal and the voltage signal is transmitted via the gate line.

As shown in FIG. 3 and FIG. 4, when the first output terminal sensor detects a normal output voltage signal, it shows that the conduction condition of the gate line is in normal, and no phenomena such as short-circuit or open-circuit occurs; at this time, none of the second output terminal sensor and the third output terminal sensor has a signal. When the gate line conducts normally, the normal output voltage signal of the signal output terminal of the gate line is the normal output voltage $V_{out}'$ calculated from the following equation 1:

$$V_{out}' = \frac{R_2 * V_{in}}{\sqrt{\left(\frac{1}{\omega_0 c_0} + \frac{1}{\omega_1 c_1}\right)^2 + (R_1 + R_2)^2}} \quad \text{equation 1}$$

Herein, $R_1$ represents an equivalent resistance value of the gate line 10, which can be measured by a multimeter or the like, $R_2$ represents the resistance value of the equivalent resistor 50, $V_{in}$ represents the input voltage from the voltage input terminal 20, $\omega_0$ represents the angular frequency of the input terminal sensor 30, $C_0$ represents the capacitance of the input terminal sensor 30, $\omega_1$ represents the angular frequency of the first output terminal sensor 41, and $C_1$ represents the capacitance of the first output terminal sensor 41.

When the output voltage signal $V_{out}$ as detected by the first output terminal sensor 41 and measured by the voltage detector 80 is inconsistent with the normal output voltage $V_{out}'$, it shows that phenomenon of a short-circuit occurs on the gate line as detected; at this time, if the second output terminal sensor 42 has a signal to be transmitted, it shows that a short-circuit occurs between the common electrode 60 to which the second output terminal sensor 42 corresponds and the gate line 10, as shown in FIG. 5 and FIG. 6; if the third output terminal sensor 43 has a signal to be transmitted, it shows that a short-circuit occurs between the common electrode 60 to which the third output terminal sensor 43 corresponds and the gate line 10; if the second output terminal sensor 42 and the third output terminal sensor 43 both have signals to be transmitted, it shows that a short-circuit occurs between each of the two common electrodes and the gate line.

When a short-circuit occurs between the gate line 10 and one of the two adjacent common electrodes 60, the distance $x_1$ between the position where the short-circuit occurs and the zero point of coordinate can be calculated based on the following equation 2:

$$V_{out} = \frac{R_2 * V_{in}}{\frac{\sqrt{(L-x_1)^2 * r^2 + \left(\frac{1}{\omega_i c_i}\right)^2} * \sqrt{(L-x_1)^2 * R^2 + \left(\frac{1}{\omega_1 c_1}\right)^2}}{\sqrt{(L-x_1)^2 * r^2 + \left(\frac{1}{\omega_i c_i}\right)^2} + \sqrt{(L-x_1)^2 * R^2 + \left(\frac{1}{\omega_1 c_1}\right)^2}} + \sqrt{(R_2 - x_1 R)^2 + \left(\frac{1}{\omega_0 c_0}\right)^2}} \quad \text{equation 2}$$

The above equation 2 is derived from the following equations 3-6:

$$Z_1 = \frac{\sqrt{(L-x_1)^2 * r^2 + \left(\frac{1}{\omega_i c_i}\right)^2} * \sqrt{(L-x_1)^2 * R^2 + \left(\frac{1}{\omega_1 c_1}\right)^2}}{\sqrt{(L-x_1)^2 * r^2 + \left(\frac{1}{\omega_i c_i}\right)^2} + \sqrt{(L-x_1)^2 * R^2 + \left(\frac{1}{\omega_1 c_1}\right)^2}} \quad \text{equation 3}$$

$$Z_2 = \sqrt{(R_2 + x_1 R)^2 + \left(\frac{1}{\omega_0 c_0}\right)^2} \quad \text{equation 4}$$

$$Z = Z_1 + Z_2 \quad \text{equation 5}$$

$$V_{out} = \frac{R_2 * V_{in}}{Z} \quad \text{equation 6}$$

Herein, the signal input terminal of the gate line is taken as the zero point of coordinate, L represents the total length of the gate line 10, $x_1$ represents the distance between the position where the short-circuit occurs and the zero point of coordinate; $V_{in}$ represents the input voltage from the voltage input terminal 20, $V_{out}$ represents the output voltage of the gate line 10 measured by the voltage detector 80, $Z_1$ represents the impedance of the wire from the position where the short-circuit occurs to the output terminal sensor (comprising the output terminal sensor), and $Z_2$ represents the impedance of the wire from the signal input terminal to the position where the short-circuit occurs and the equivalent resistor 50.

R represents the equivalent resistance value of the gate line 10 per unit length, wherein $$R = \frac{R_1}{L}$$

$R_1$ represents the equivalent resistance value of the gate line 10.

r represents the equivalent resistance value of the common electrode 60 per unit length with which the gate line 10 forms a short-circuit, $$r = \frac{r_1}{L}$$

$r_1$ represents the equivalent resistance value of the common electrode 60 with which the gate line 10 forms a short-circuit.

$R_2$ represents the resistance value of the equivalent resistor 50.

$\omega_0$ represents the angular frequency of the input terminal sensor 30, $C_0$ represents the capacitance of the input terminal sensor 30, $\omega_1$ represents the angular frequency of the first output terminal sensor 41, and $C_1$ represents the capacitance of the first output terminal sensor 41; $\omega_i$ represents the angular frequency of the output terminal sensor of the signal output terminal of the wire with which the wire to be detected forms a short-circuit, and $C_i$ represents the capacitance of the output terminal sensor of the signal output terminal of the wire with which the wire to be detected forms a short-circuit; herein, i represents a natural number greater than 2, and i is equal to 2 or 3 in the present embodiment; $\omega_2$ represents the angular frequency of the second output terminal sensor 42, and $C_2$ represents the capacitance of the second output terminal sensor 42, $\omega_3$ represents the angular frequency of the third output terminal sensor 43, and $C_3$ represents the capacitance of the third output terminal sensor 43.

Figure 7:
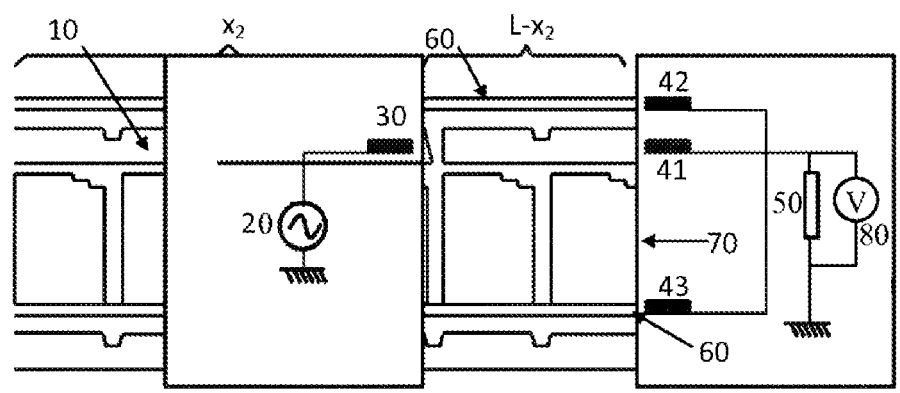
FIG. 7 is a schematic diagram of the line detecting apparatus according to the embodiment of the present disclosure in an open-circuit.
Figure 8:
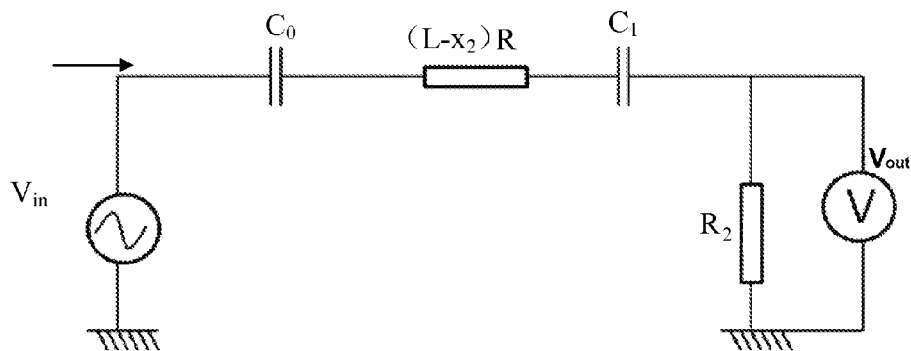
FIG. 8 is a schematic diagram of the line detecting apparatus according to the embodiment of the present disclosure in the open-circuit.

As shown in FIG. 7 and FIG. 8, when the voltage detector 80 detects no output signal of the gate line, it can be determined that there occurs an open-circuit on the gate line, and the first output terminal sensor 41 receives no signal; at this time, the input terminal sensor 30 is moved in the direction toward the output terminal of the gate line 10 until the first output terminal sensor 41 detects a signal, and the voltage detector 80 can detect the signal; the distance $x_2$ between the position where the open-circuit occurs on the gate line 10 and the zero point of coordinate can be calculated from the following equation 7:

$$x_2 = L - \frac{\sqrt{\left(\frac{R_2 * V_{in}}{V_{out}}\right)^2 - \left(\frac{1}{\omega_0 c_0} + \frac{1}{\omega_1 c_1}\right)^2} - R_2}{R} \quad \text{equation 7}$$

The equation 7 is derived from the following equations 8 and 9:

$$V_{out} = \frac{R_2 * V_{in}}{\sqrt{\left(\frac{1}{\omega_0 c_0} + \frac{1}{\omega_1 c_1}\right)^2 + [(L-x_2)R + R_2]^2}} \quad \text{equation 8}$$

$$(L-x_2)R = \sqrt{\left(\frac{R_2 * V_{in}}{V_{out}}\right)^2 - \left(\frac{1}{\omega_0 c_0} + \frac{1}{\omega_1 c_1}\right)^2} - R_2 \quad \text{equation 9}$$

Herein, the signal input terminal of the gate line 10 is taken as the zero point of coordinate, $x_2$ represents the distance between the position where the open-circuit occurs and the zero point of coordinate, and L represents the total length of the gate line.

R represents the equivalent resistance value of the gate line 10 per unit length, wherein $$R = \frac{R_1}{L}.$$

$V_{in}$ represents the input voltage from the voltage input terminal 20, $V_{out}$ represents the output voltage of the gate line 10 measured by the voltage detector 80, and $R_2$ represents the resistance value of the equivalent resistor 50.

$\omega_0$ represents the angular frequency of the input terminal sensor 30, $C_0$ represents the capacitance of the input terminal sensor 30, $\omega_1$ represents the angular frequency of the first output terminal sensor 41, and $C_1$ represents the capacitance of the first output terminal sensor 41.

Fourth Embodiment

The present embodiment proposes a detecting method based on the line detecting apparatus for array substrate of the second embodiment, and the detecting method of the fourth embodiment differs from that of the third embodiment only in that: the wire to be detected is a data line; accordingly, the at least two output terminal sensors comprise a first output terminal sensor and a second output terminal sensor, wherein the first output terminal sensor is arranged at a signal output terminal of the data line, and the second output terminal sensor is arranged at a signal output terminal of another data line adjacent to the data line; the detecting and calculating procedures in the fourth embodiment are similar to those in the third embodiment, and differences are only in that: the gate line is replaced by the data line, and the two common electrodes with which the gate line forms a short-circuit or an open-circuit are replaced by another data line.

In the present embodiment, every two adjacent data lines are grouped together and serve as one detecting unit, and a line detecting job for one detecting unit is performed at a time; when the line detecting job for one detecting unit is completed, a line detecting job for a next detecting unit is performed after moving the detecting position by integral multiple detecting units. The two output terminal sensors in each detecting unit are set as the first output terminal sensor and the second output terminal sensor respectively.

In the line detecting apparatus and method for the array substrate provided in the above embodiments, when the sensors perform line scan, the coordinate of the specific location where the short-circuit or open-circuit occurs can be found directly without performing scan by PDS or AOI, thus reducing the technical processes, shortening the time for detecting, and saving the production cost.

It should be appreciated that the above embodiments are only preferred embodiments of the present disclosure. It will be obvious that those skilled in the art may make improvements and replacements to the above embodiments without departing from the technical principle of the present disclosure. Such improvements and replacements are intended to be included within the protection scope of the present disclosure.

What is claimed is:

1. A line detecting apparatus for an array substrate, comprising: a voltage input terminal; an input terminal sensor connected to the voltage input terminal; an equivalent resistor and a voltage detector connected in parallel; at least two output terminal sensors wherein the input terminal sensor is arranged at a signal input terminal of a wire to be detected, a first output terminal sensor in the at least two output terminal sensors is arranged at a signal output terminal of the wire to be detected, each of other output terminal sensors in the at least two output terminal sensors is arranged at a signal output terminal of another wire adjacent to the wire to be detected respectively, a signal input terminal of the wire adjacent to the wire to be detected is floated, wherein the equivalent resistor and the voltage detector connected in parallel are connected to one of said at least two output terminal sensors, and the voltage detector is configured to read a voltage at the signal output terminal of the wire to be detected when being connected to the signal output terminal of the wire to be detected, and to read a voltage at the signal output terminal of the wire adjacent to the wire to be detected when being connected to the signal output terminal of the wire adjacent to the wire to be detected.

2. The line detecting apparatus for array substrate of claim 1, wherein the wire to be detected is a gate line, and the at least two output terminal sensors comprise the first output terminal sensor, a second output terminal sensor and a third output terminal sensor, the first output terminal sensor is arranged at a signal output terminal of the gate line, the second output terminal sensor and the third output terminal sensor are arranged respectively at signal output terminals of two common electrodes adjacent to the gate line.

3. The line detecting apparatus for array substrate of claim 1, wherein the wire to be detected is a data line, and the at least two output terminal sensors comprise a first output terminal sensor and a second output terminal sensor, the first output terminal sensor is arranged at a signal output terminal of the data line, and the second output terminal sensor is arranged at a signal output terminal of another data line adjacent to the data line.

4. A detecting method based on the line detecting apparatus for array substrate of claim 1, comprising: arranging the input terminal sensor at a signal input terminal of a wire to be detected, arranging a first output terminal sensor of the at least two output terminal sensors at a signal output terminal of the wire to be detected, and arranging each of the other output terminal sensors at the signal output terminal of another wire adjacent to the wire to be detected; measuring an output voltage of the wire to be detected by the voltage detector; determining a line conduction condition of the wire to be detected by comparing the voltage as measured to a normal output voltage.

5. The detecting method of claim 4, wherein the wire to be detected is a gate line, and the at least two output terminal sensors comprise the first output terminal sensor, a second output terminal sensor and a third output terminal sensor, the first output terminal sensor is arranged at the signal output terminal of the gate line, the second output terminal sensor and the third output terminal sensor are arranged respectively at signal output terminals of two common electrodes adjacent to the gate line.

6. The detecting method of claim 4, wherein the wire to be detected is a data line, and the at least two output terminal sensors comprise the first output terminal sensor and a second output terminal sensor, the first output terminal sensor is arranged at the signal output terminal of the data line, and the second output terminal sensor is arranged at the signal output terminal of another data line adjacent to the data line.

7. The detecting method of claim 4, wherein it is determined that a short-circuit occurs on the wire to be detected as the wire to be detected has a signal output which is inconsistent with a normal value, and the distance between the position where the short-circuit occurs and the zero point of coordinate is determined according to the output voltage value of the wire to be detected measured by the voltage detector.

8. The detecting method of claim 4, wherein, it is determined that an open-circuit occurs on the wire to be detected as the wire to be detected has no signal output, the input terminal sensor is moved in the direction toward the output terminal of the wire to be detected until the output terminal sensor detects a signal.

9. The detecting method of claim 8, wherein, when the input terminal sensor is moved to a position where the output terminal sensor detects a signal, the distance from the position where the open-circuit occurs to the zero point of coordinate is determined according to the output voltage value of the wire to be detected measured by the voltage detector.

10. The detecting method of claim 4, wherein, after completing the determination of the line conduction condition of the wire to be detected according to the output voltage of the wire to be detected as measured, the detecting method comprises: moving positions of all the output terminal sensors by one detecting unit in a direction perpendicular to the longitudinal direction of the wire to be detected so as to detect the line conduction condition of a next detecting unit.

11. The detecting method of claim 5, wherein, it is determined that a short-circuit occurs on the wire to be detected as the wire to be detected has a signal output which is inconsistent with a normal value, and the distance between the position where the short-circuit occurs and the zero point of coordinate is determined according to the output voltage value of the wire to be detected measured by the voltage detector.

12. The detecting method of claim 6, wherein it is determined that a short-circuit occurs on the wire to be detected as the wire to be detected has a signal output which is inconsistent with a normal value, and the distance between the position where the short-circuit occurs and the zero point of coordinate is determined according to the output voltage value of the wire to be detected measured by the voltage detector.

13. The detecting method of claim 5, wherein, it is determined that an open-circuit occurs on the wire to be detected as the wire to be detected has no signal output, and the input terminal sensor is moved in the direction toward the output terminal of the wire to be detected until the output terminal sensor detects a signal.

14. The detecting method of claim 6, wherein, it is determined that an open-circuit occurs on the wire to be detected as the wire to be detected has no signal output, and the input terminal sensor is moved in the direction toward the output terminal of the wire to be detected until the output terminal sensor detects a signal.

15. The detecting method of claim 11, wherein, when the input terminal sensor is moved to a position where the output terminal sensor detects a signal, the distance from the position where the open-circuit occurs to the zero point of coordinate is determined according to the output voltage value of the wire to be detected measured by the voltage detector.

16. The detecting method of claim 12, wherein, when the input terminal sensor is moved to a position where the output terminal sensor detects a signal, the distance from the position where the open-circuit occurs to the zero point of coordinate is determined according to the output voltage value of the wire to be detected measured by the voltage detector.

* * * * *